US010540471B2

(12) United States Patent
Chae et al.

(10) Patent No.: US 10,540,471 B2
(45) Date of Patent: Jan. 21, 2020

(54) LAYOUT DESIGN SYSTEM AND SEMICONDUCTOR DEVICE FABRICATED USING THE SAME

(71) Applicant: Samsung Electronics Co., Ltd., Suwon-si, Gyeonggi-do (KR)

(72) Inventors: Kyoung Kuk Chae, Suwon-si (KR); Hoi Jin Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

(21) Appl. No.: 15/590,294

(22) Filed: May 9, 2017

(65) Prior Publication Data

US 2017/0329885 A1 Nov. 16, 2017

(30) Foreign Application Priority Data

May 11, 2016 (KR) ........................ 10-2016-0057347
Sep. 2, 2016 (KR) ........................ 10-2016-0113330

(51) Int. Cl.

*G06F 17/50* (2006.01)
*H01L 27/02* (2006.01)
*H01L 27/088* (2006.01)
*H01L 29/78* (2006.01)
*H01L 27/11575* (2017.01)

(52) U.S. Cl.

CPC ...... *G06F 17/5072* (2013.01); *H01L 27/0207* (2013.01); *H01L 27/088* (2013.01); *H01L 27/11575* (2013.01); *H01L 29/78* (2013.01)

(58) Field of Classification Search

CPC ............... H01L 27/0207; H01L 27/088; H01L 27/11565; H01L 27/1157; H01L 27/11575; H01L 29/78; H01L 17/5072

See application file for complete search history.

(56) References Cited

U.S. PATENT DOCUMENTS

| | | | | |
|---|---|---|---|---|
| 5,279,982 | A * | 1/1994 | Crotti | H01L 27/115 257/E27.103 |
| 6,635,936 | B1 | 10/2003 | Wuu et al. | |
| 6,876,025 | B2 | 4/2005 | Sommer et al. | |
| 7,196,363 | B2 | 3/2007 | Montagnana | |
| 7,444,609 | B2 | 10/2008 | Charlebois et al. | |
| 7,767,515 | B2 * | 8/2010 | Moroz | H01L 21/823807 257/E21.642 |
| 7,808,017 | B2 * | 10/2010 | Hamada | H01L 27/0207 257/202 |
| 7,895,548 | B2 | 2/2011 | Lin et al. | |
| 7,897,479 | B2 * | 3/2011 | Lin | H01L 21/823807 257/374 |

(Continued)

*Primary Examiner* — Helen Rossoshek

(74) *Attorney, Agent, or Firm* — Harness, Dickey & Pierec, P.L.C.

(57) ABSTRACT

A semiconductor device is provided. A semiconductor device includes a filler cell including first and second insulating structures, the first and second insulating structures extending in a first direction, the filler cell being defined by first cell boundaries; and a neighboring cell including a third insulating structure, the third insulating structure extending in the first direction, the neighboring cell being adjacent to the filler cell in the first direction and defined by second cell boundaries, wherein the first and second insulating structures are spaced apart from one another in a second direction, is the second direction being perpendicular to the first direction.

19 Claims, 14 Drawing Sheets

14

120b 120c 120d 120e
150a 150d
120a 120f B
A
130a 130b 130c
150b 150e
122a 122e
150c 150f
122b 122c 122d
Y
X

(56) References Cited

U.S. PATENT DOCUMENTS 7,919,792 B2 4/2011 Law et al.
8,069,430 B2 * 11/2011 Moroz ................ G06F 17/5068 716/119
8,217,469 B2 * 7/2012 Hou ................ H01L 21/823871 257/288
8,527,933 B2 9/2013 Sharma
8,677,292 B2 3/2014 Fu et al.
8,694,942 B2 4/2014 Lin et al.
9,318,477 B2 * 4/2016 Lee ..................... H01L 27/0207
2011/0140203 A1 * 6/2011 Hou ................ H01L 21/823871 257/401
2015/0084129 A1 * 3/2015 Lee ..................... H01L 29/6681 257/347
2015/0091188 A1 * 4/2015 Lee ................. H01L 21/823828 257/774
2016/0049395 A1 * 2/2016 Okagaki ............. G06F 17/5077 257/401
2016/0085898 A1 3/2016 Manohar et al.
2016/0092624 A1 3/2016 Somayaji et al.
2016/0099243 A1 * 4/2016 Azmat .................. H01L 27/088 257/368
2016/0110489 A1 4/2016 Schroeder et al.
2016/0117431 A1 * 4/2016 Kim .................... G06F 17/5072 716/119
2017/0278863 A1 * 9/2017 Cha ................... H01L 27/11582
2018/0130786 A1 * 5/2018 Deepak ............... H01L 27/0207
2019/0012423 A1 * 1/2019 Lee ..................... G06F 17/5081

* cited by examiner

LAYOUT DESIGN SYSTEM AND SEMICONDUCTOR DEVICE FABRICATED USING THE SAME

This application claims priority to Korean Patent Application No. 10-2016-0057347 filed on May 11, 2016 and No. 10-2016-011330 filed on Sep. 2, 2016 in the Korean Intellectual Property Office, and all the benefits accruing therefrom under 35 U.S.C. § 119, the disclosure of which is incorporated herein by reference in its entirety.

BACKGROUND

The inventive concepts relate to a layout design system and a semiconductor device fabricated using the same.

A desire for miniaturized semiconductor devices has rapidly increased. To fabricate a compact semiconductor device, a layout design capable of improving the reliability of a semiconductor device is desired. A layout design capable of securing insulation between adjacent transistors and reducing the likelihood that the properties of transistors change is desired.

SUMMARY

Example embodiments of the inventive concepts provide a layout design system capable of creating a layout design that improves or guarantees product reliability.

Example embodiments of the inventive concepts also provide a semiconductor device with improved reliability, fabricated by the layout design system.

However, example embodiments of the inventive concepts are not restricted to those set forth herein. The above and other example embodiments of the inventive concepts will become more apparent to one of ordinary skill in the art to which the inventive concepts pertain by referencing the detailed description of the inventive concepts given below.

According to an example embodiment of the inventive concepts, there is provided a semiconductor device including a filler cell including first and second insulating structures, the first and second insulating structures extending in a first direction, the filler cell being defined by first cell boundaries; and a neighboring cell including a third insulating structure, the third insulating structure extending in the first direction, the neighboring cell being adjacent to the filler cell in the first direction and defined by second cell boundaries, wherein the first and second insulating structures are spaced apart from one another in a second direction, the second direction being perpendicular to the first direction.

According to an example embodiment of the inventive concepts, there is provided a semiconductor device including a first cell including first and second insulating structures, the first and second insulating structures extending in a first direction, the first cell being defined by first cell boundaries; and a second cell adjacent to the first cell in a second direction, the second direction being perpendicular to the first direction, wherein the first and second insulating structures are spaced apart from one another in the second direction.

According to an example embodiment of the inventive concepts, there is provided a layout design system including a nontransitory instruction storage unit configured to store machine readable instructions and a processor configured to execute the machine readable instructions to generate at least one filler design. The at least one filler design includes first and second insulating structures extending in a first direction, the first and second insulating structures being spaced apart from one another in a second direction, the second direction being perpendicular to the first direction.

Other features and example embodiments may be apparent from the following detailed description, the drawings, and the claims.

BRIEF DESCRIPTION OF THE DRAWINGS

The above and other example embodiments and features of the inventive concepts will become more apparent by describing in detail example embodiments thereof with reference to the attached drawings, in which.

DETAILED DESCRIPTION

Figure 1:
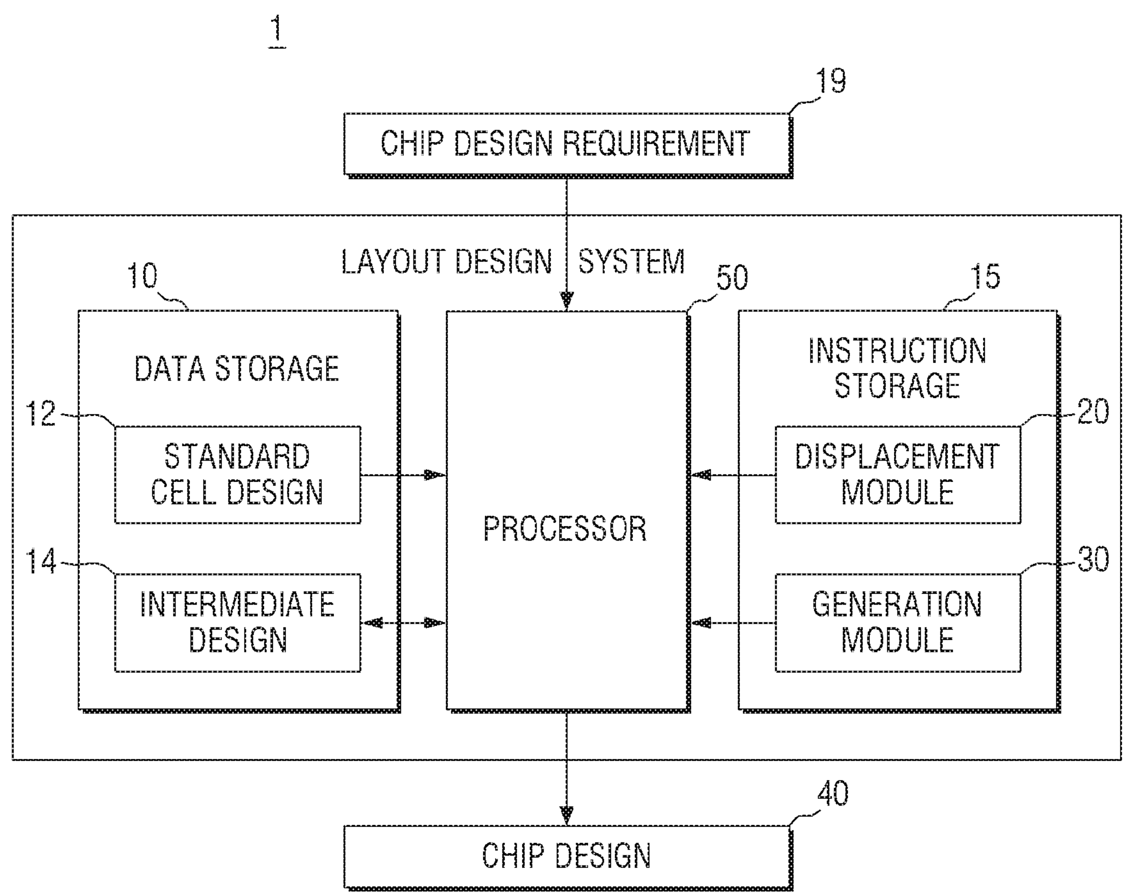
FIG. 1 is a block diagram of a layout design system according to an example embodiment of the inventive concepts.

FIG. 1 is a block diagram of a layout design system according to an example embodiment of the inventive concepts.

The term "unit" or "module", as used herein, may refer to, but is not limited to, for example, a software or hardware component, such as a field programmable gate array (FPGA) or an application specific integrated circuit (ASIC), which performs certain tasks. A unit or module may advantageously be configured to reside in a non-transitory addressable storage medium and may be configured to execute on one or more processors. A unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided in the components and in the units or modules may be combined into fewer components and into fewer units or modules, or may be further separated into additional components and into additional units or modules.

Referring to FIG. 1, a layout design system 1 includes a data storage unit 10, an instruction storage unit 15 including a displacement module 20 and a generation module 30, and a processor 50.

A standard cell design 12 may be stored in the data storage unit 10. A standard cell may be a minimal unit for forming a block, a device, or a chip. For example, a standard cell of a static random access memory (SRAM) or logic device may be an inverter cell.

The standard cell design 12 may include a layout for fabricating a standard cell. For example, the standard cell design 12 may include an active region and a gate region, which is on the active region.

FIG. 1 illustrates the data storage unit 10 as storing only one standard cell design 1 therein, but the inventive concepts are not limited thereto. For example, in some example embodiments, the data storage unit 10 may store a plurality of standard cell designs 12 that form a single block, device, or chip. In other words, a plurality of standard cell designs 12 may be stored in the data storage unit 10 in the form of a library.

The data storage unit 10 may also store an intermediate design 14 output by the processor 50 executing the displacement module 20. In the present example embodiment, the intermediate design 14 may include the standard cell designs 12 and filler designs, which are adjacent to the standard cell designs 12 and have a plurality of insulating structures therein. The intermediate design 14 will be described later in detail.

In the present example embodiment, the standard cell designs 12 may be used as inputs for the processor 50 to execute the displacement module 12, and the intermediate design 14 may be used as an input for the processor 50 to execute the generation module 30.

In some example embodiments, the data storage unit 10 may be implemented as, for example, a non-volatile memory device. Examples of the non-volatile memory device may include a NAND flash memory, a NOR flash memory, a magnetoresistive random access memory (MRAM), a phase-change random access memory (PRAM), a resistive random access memory (RRAM), and the like, but the inventive concepts are not limited thereto. In some other example embodiments, the data storage unit 10 may be implemented as a hard disk drive, a magnetic storage device, or the like.

The processor 50 may execute the displacement module 20 to generate the intermediate design 14 by arranging the standard cell designs 12, with the use of the processor 50, according to a chip design requirement 19. The intermediate design 14 may be stored in the data storage unit 10, but the inventive concepts are not limited thereto.

The chip design requirement 19, which is provided to the processor 50 executing the displacement module 20, may be input by a user. Alternatively, the chip design requirement 19 may be stored in advance in the data storage unit 10.

In some example embodiments, the displacement module 20 may be implemented in the form of software, but the inventive concepts are not limited thereto.

The processor 50 may execute the generation module 30 to generate a design element in the intermediate design 14. In the present example embodiment, examples of the design element include, for example, an active region, a dummy gate region, and the like, but the inventive concepts are not limited thereto.

In the present example embodiment, the processor 50 may execute the generation module 30 to generate a plurality of insulating structures, and the plurality of insulating structures may be in the filler designs, which are arranged adjacent to the standard cell designs 12 included in the intermediate design 14, to be spaced apart from one another. The plurality of insulating structures will be described later in detail.

In some example embodiments, the generation module 30 may be implemented in the form of software, but the inventive concepts are not limited thereto.

In some example embodiments, in a case in which the displacement module 20 and the generation module 30 are both implemented in the form of software, the displacement module 20 and the generation module 30 may be stored in the instruction storage unit 15, which is separate from the data storage unit 10, in the form of code.

The processor 50 may be used for the displacement module 20 and the generation module 30 to perform computation. FIG. 1 illustrates only one processor 50, but the inventive concepts are not limited thereto. In some example embodiments, more than one processor 50 may be provided. In other words, the layout design system 1 may be configured to be driven in a multi-core environment. In a case in which the layout design system 1 is driven in a multi-core environment, the efficiency of computation may be improved.

Although not specifically illustrated in FIG. 1, the processor 50 may further include cache memories such as L1 and L2 cache memories for an improved computation capability.

FIG. 1 illustrates an example in which the layout design system 1 generates a chip design 40 by arranging the standard cell designs 12 according to the chip design requirement 19, but the inventive concepts are not limited thereto. For example, in some other example embodiments, the layout design system 1 may generate a block design (not illustrated) by arranging the standard cell designs 12 according to a block design requirement (not illustrated).

Figure 2:
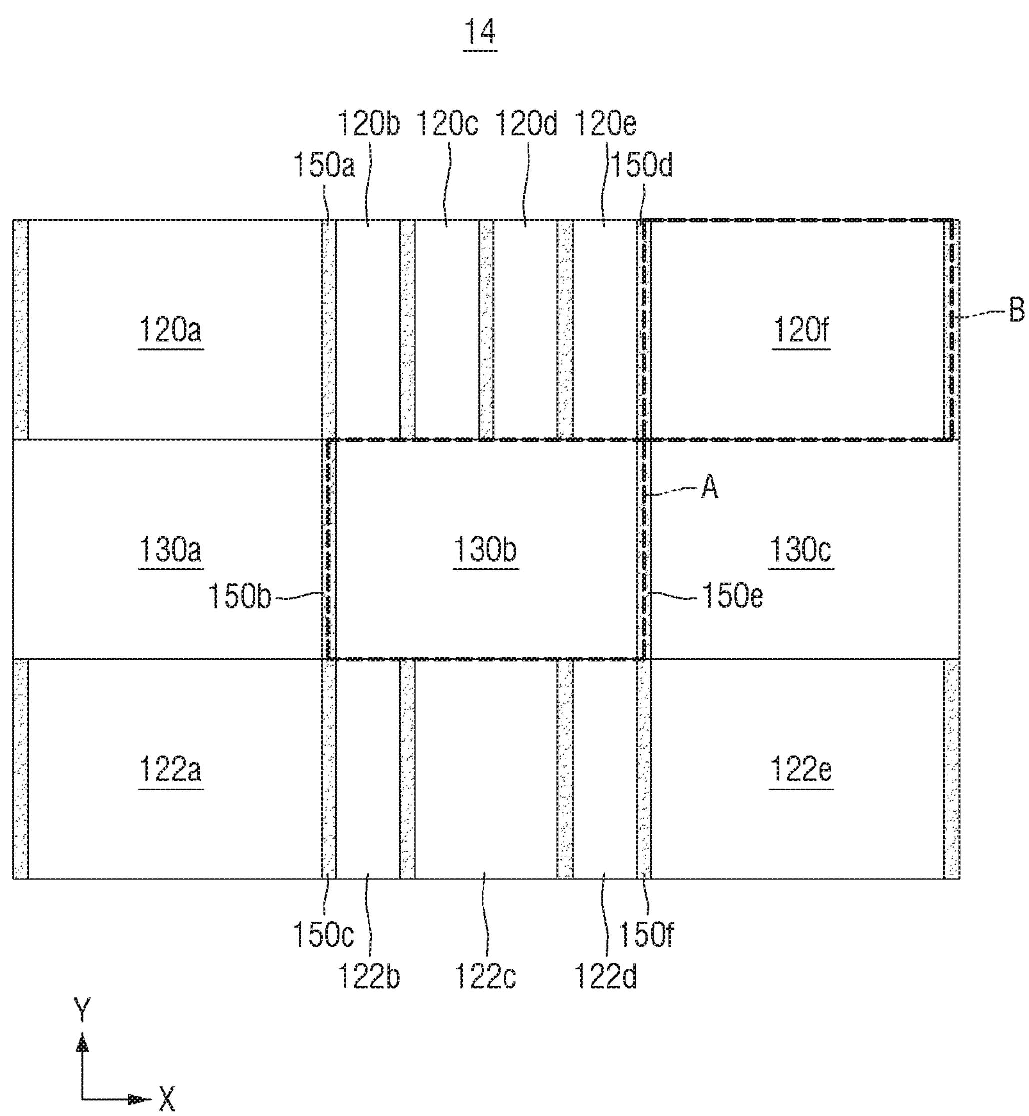
FIG. 2 is a layout view of a semiconductor device according to an example embodiment of the inventive concepts.

FIG. 2 is a layout view of a semiconductor device according to an example embodiment of the inventive concepts. For example, the layout view of FIG. 2 may be the layout view of the intermediate design 14 of FIG. 1.

Referring again to FIG. 1, the processor 50 may execute the displacement module 20 to arrange the standard cell designs 12 according to the chip design requirement 19. The displacement module 20 may arrange the filler designs among the standard cell designs 12, thereby generating the intermediate design 14.

FIG. 2 illustrates an example of the arrangement of a plurality of standard cell designs 120*a* through 120*f*, a plurality of standard cell designs 122*a* through 122*e*, and a plurality of filler designs 130*a* through 130*c* according to the chip design requirement 19.

Referring to FIG. 2, the standard cell designs 120*a* and 120*f* and the standard cell designs 122*a* through 122*e* may be at the top and the bottom, respectively, of the intermediate design 14. The filler designs 130*a* through 130*c* may be between the standard cell designs 120*a* and 120*f* and the standard cell designs 122*a* through 122*e*.

For convenience, the standard cell designs 120*a* through 120*f* are illustrated as, but are not limited to, being adjacent to the filler designs 130*a* through 130*c* in a first direction Y, and the standard cell designs 122*a* through 122*e* are also illustrated as, but are also not limited to, being adjacent to the filler designs 130*a* through 130*c* in the first direction Y. For example, the standard cell designs 120*a* through 120*f* or 122*a* through 122*e* may be adjacent to the filler designs 130*a* through 130*c* in a second direction X.

One or more of the filler designs 130*a* through 130*c* may be defined by first cell boundaries. For example, the filler design 130*b* may be defined by first cell boundaries A. One or more of the standard cell designs 120*a* through 120*f* and the standard cell designs 122*a* through 122*e* may be defined by second cell boundaries. For example, the standard cell design 120*f* may be defined by second cell boundaries B.

Insulating structures are formed among the standard cell designs 120*a* through 120*f* and among the standard cell designs 122*a* through 122*e*. For example, an insulating structure 150*a* may be formed along the boundary between the standard cell designs 120*a* and 120*b* in the first direction Y, and an insulating structure 150*d* may be formed along the boundary between the standard cell designs 120*e* and 120*f* in the first direction Y. An insulating structure 150*c* may be formed along the boundary between the standard cell designs 122*a* and 122*b* in the first direction Y, and an insulating structure 150*f* may be formed along the boundary between the standard cell designs 122*d* and 120*e* in the first direction Y.

Insulating structures may also be formed among the filer designs 130*a* through 130*c*. For example, an insulating structure 150*b* may be formed along the boundary between the filler designs 130*a* and 130*b*, and an insulating structure 150*e* may be formed along the boundary between the filler designs 130*b* and 130*c*.

Insulating structures are for providing electric insulation among designs that respectively define cells. Particularly, insulating structures 150*a*, 150*b*, and 150*c* or the insulating structures 150*d*, 150*e*, and 150*f*, which extend in line in the first direction Y, may also change the properties of devices such as transistors in their neighboring cell regions.

More specifically, the insulating structures 150*a*, 150*b*, and 150*c* or the insulating structures 150*d*, 150*e*, and 150*f* may be formed by forming trenches on a semiconductor substrate, or in an active region on the semiconductor substrate, and burying the trenches with an insulating material. The insulating structures 150*a*, 150*b*, and 150*c* or the insulating structures 150*d*, 150*e*, and 150*f* may apply stress to transistors formed in a cell region. Particularly, the insulating structures 150*a*, 150*b*, and 150*c* or the insulating structures 150*d*, 150*e*, and 150*f*, which extend in line in the first direction Y, may increase the stress applied to the transistors formed in the cell region.

If the stress applied to the transistors formed in the cell region too excessively increases, the operation properties of the transistors formed in the cell region may change, thereby making it challenging to estimate the properties of the transistors formed in the cell region.

Figure 3:
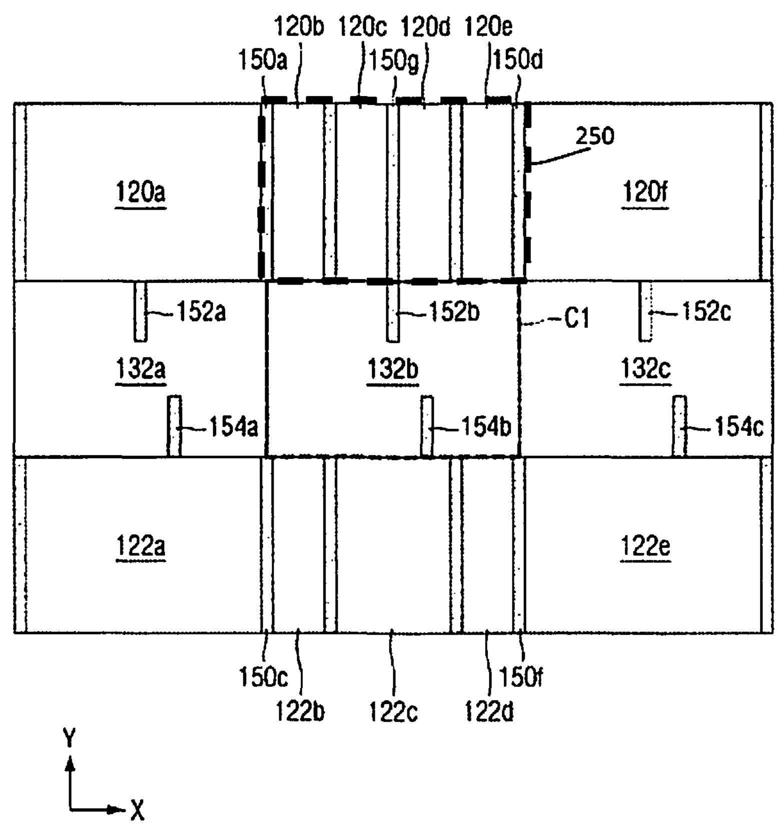
FIG. 3 is a layout view of a semiconductor device according to another example embodiment of the inventive concepts.
Figure 4:
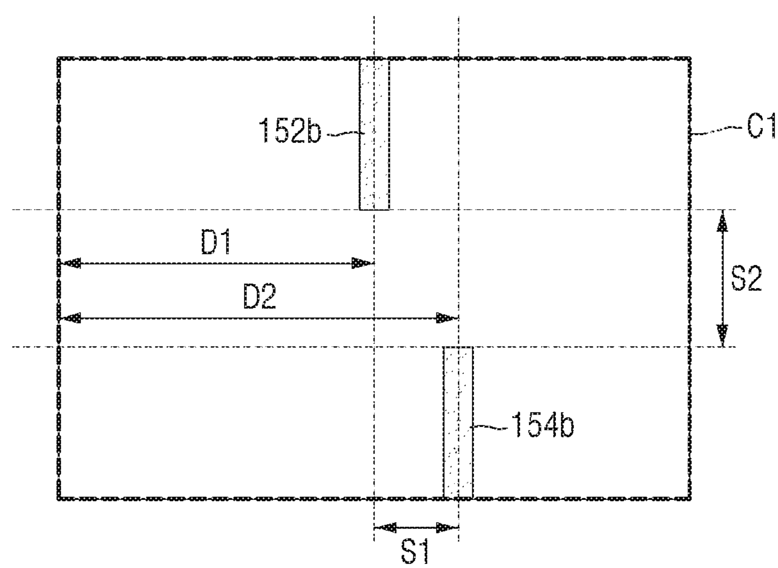
FIG. 4 is a schematic view illustrating a filler cell of FIG. 3.

FIG. 3 is a layout view of a semiconductor device according to another example embodiment of the inventive concepts. More specifically, the layout view of FIG. 3 may be the layout view of, for example, the intermediate design 14 of FIG. 1. FIG. 4 is a schematic view illustrating a filler design of FIG. 3.

Referring to FIG. 3, in the present example embodiment, unlike in the example embodiment of FIG. 2, an intermediate design 14 includes filler designs 132*a* through 132*c*, each having a plurality of insulating structures that are spaced apart from one another in a second direction X, between an array of standard cell designs 120*a* through 120*f* and an array of standard cell designs 122 through 122*e*.

Referring to FIGS. 3 and 4, the filler design 132*b* includes first and second insulating structures 152*b* and 154*b*, which are formed in a first direction Y. The filler design 132*b* is defined by first cell boundaries C1. A border 250 is shown around standard designs that neighbor filler design 132*b* in the first direction.

In the present example embodiment, at least one of the first and second insulating structures 152*b* and 154*b* may be spaced apart from the first cell boundaries C1 in the second direction X. For example, the first and second insulating structures 152*b* and 154*b* may be with a gap S1 therebetween in the second direction X.

In the present example embodiment, the first insulating structure 152*b* may be a first distance D1 apart from a first cell boundary C1 on a first side of the filler design 132*b* in the second direction X, and the second insulating structure 154*b* may be a second distance D2 apart from the first cell boundary C1 on the first side of the filler design 132*b* in the second direction X.

In the present example embodiment, the first and second insulating structures 152*b* and 154*b* may not overlap with each other in the second direction X. In other words, the first and second insulating structures 152*b* and 154*b* may be with a gap S2 therebetween in the first direction Y.

Referring again to FIG. 3, the standard cell designs 120*c* and 120*d* have a third insulating structure 150*g* formed therebetween in the first direction Y, and are adjacent to the filler design 132*b* in the first direction Y. One or more of the standard cell designs 120*c* and 120*d* may be defined by second cell boundaries.

For example, in the filler design 132*b*, the first insulating structure 152*b* may be connected to the third insulating structure 150*g*, but the second insulating structure 154*b* may not be connected to the third insulating structure 150*g*. For example, in the filler design 132*b*, the first insulating structure 152*b* may be contiguous with the third insulating structure 150*g*, but the second insulating structure 154*b* may not be contiguous with the third insulating structure 150*g*.

Accordingly, a plurality of insulating structures may not be formed in line with one another in the first direction Y, and as a result, stress may be prevented or reduced from being applied to transistors formed in a cell region.

In the example embodiment, cell designs adjacent to the filler design 132*b* in the first direction Y are standard cell designs such as the standard cell designs 120*c* and 120*d*, but the inventive concepts are not limited thereto. For example, filler designs, instead of standard cell designs, may be adjacent to the filler design 132*b* in the first direction Y.

Figure 5:
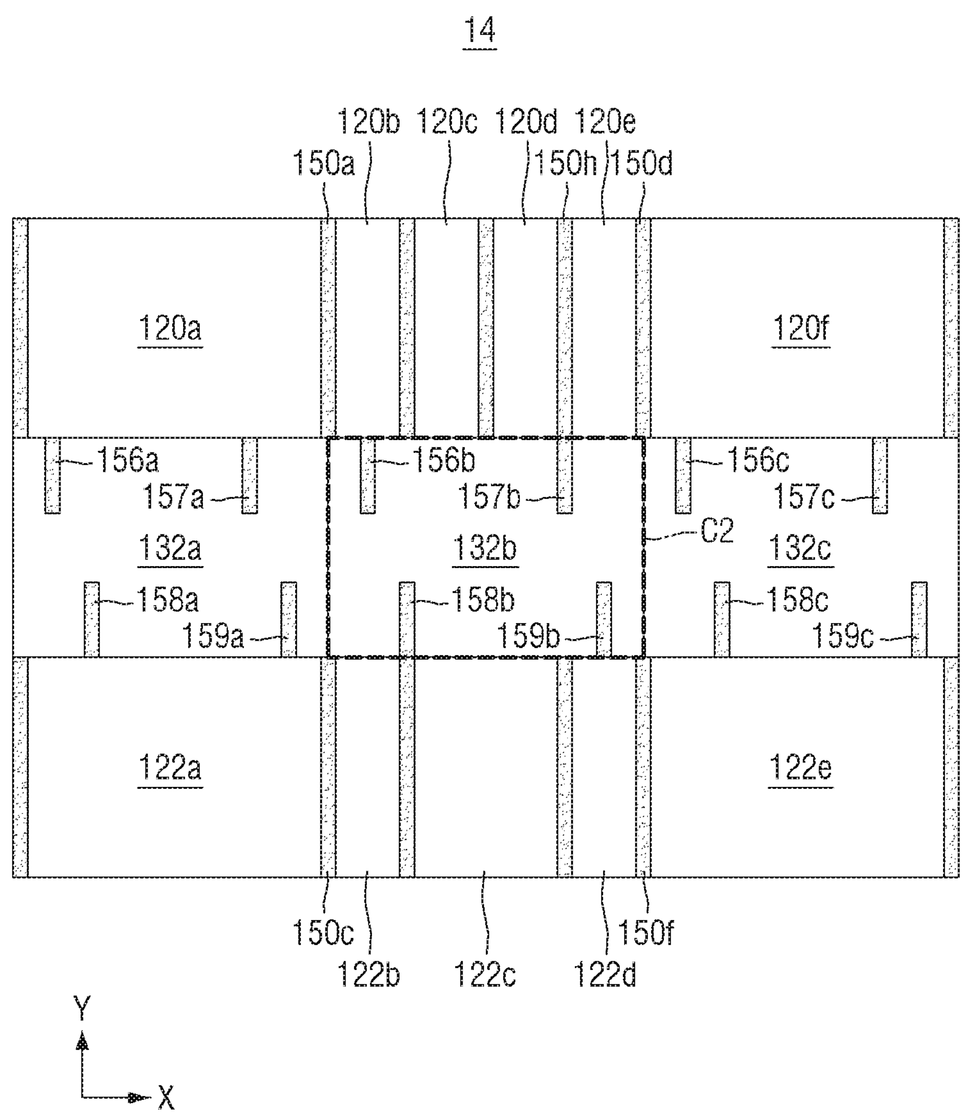
FIG. 5 is a layout view of a semiconductor device according to another example embodiment of the inventive concepts.
Figure 6:
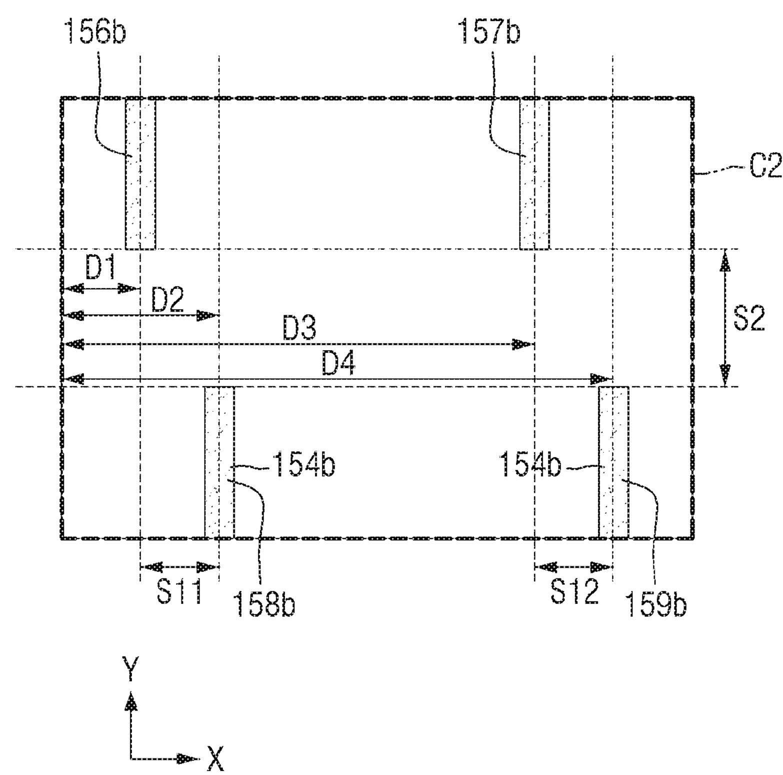
FIG. 6 is a schematic view illustrating a filler cell of FIG. 5.

FIG. 5 is a layout view of a semiconductor device according to another example embodiment of the inventive concepts. More specifically, the layout view of FIG. 5 may be the layout view of, for example, the intermediate design 14 of FIG. 1. FIG. 6 is a schematic view illustrating a filler design of FIG. 5.

Referring to FIGS. 5 and 6, in the present example embodiment, unlike in the example embodiment of FIGS. 3 and 4, a filler design 134*b* includes first and second insulating structures 156*b* and 158*b*, which are formed in a first direction Y, and fourth and fifth insulating structures 157*b* and 159*b*, which are also formed in the first direction Y. The filler design 134*b* is defined by first cell boundaries C2.

In the present example embodiment, at least one of the first and second insulating structures 156*b* and 158*b* may be spaced apart from the first cell boundaries C2 in a second direction X. For example, the first and second insulating structures 156*b* and 158*b* may be with a gap S11 therebetween in the second direction X.

At least one of the fourth and fifth insulating structures 157*b* and 159*b* may be spaced apart from the first cell boundaries C2 in a second direction X. For example, the fourth and fifth insulating structures 157*b* and 159*b* may be with a gap S12 therebetween in the second direction X.

In the example embodiment, the gaps S11 and S12 may have the same width, but the inventive concepts are not limited thereto. For example, in some other example embodiments, the gaps S11 and S12 may be set to have a different width from each other.

In the example embodiment, the first insulating structure 156*b* may be a first distance D1 apart from a first cell boundary C1 on a first side of the filler design 134*b* in the second direction X, and the second insulating structure 158*b* may be a second distance D2 apart from the first cell boundary C1 on the first side of the filler design 134*b* in the second direction X. The fourth insulating structure 157*b* may be a third distance D3 apart from the first cell boundary C1 on the first side of the filler design 134*b* in the second direction X, and the fifth insulating structure 159*b* may be a fourth distance D4 apart from the first cell boundary C1 on the first side of the filler design 134*b* in the second direction X.

In the example embodiment, the first and second insulating structures 156*b* and 158*b* may not overlap with each other in the second direction X. In other words, the first and second insulating structures 156*b* and 158*b* may be with a gap S2 therebetween in the first direction Y. The fourth and fifth insulating structures 157*b* and 159*b* may not overlap with each other in the second direction X. In other words, the fourth and fifth insulating structures 157*b* and 159*b* may be with the gap S2 therebetween in the first direction Y.

Referring again to FIG. 5, the standard cell designs 120*d* and 120*e* have a third insulating structure 150*h* formed therebetween in the first direction Y, and are adjacent to the filler design 134*b* in the first direction Y. One or more of the standard cell designs 120*d* and 120*e* may be defined by second cell boundaries.

For example, in the filler design 134*b*, the fourth insulating structure 157*b* may be connected to the third insulating structure 150*h*, but the second insulating structure 159*b* may not be connected to the third insulating structure 150*h*.

Accordingly, a plurality of insulating structures may be prevented from being formed in line with one another in the first direction Y, and as a result, too excessive stress may be prevented from being applied to transistors formed in a cell region.

Figure 7:
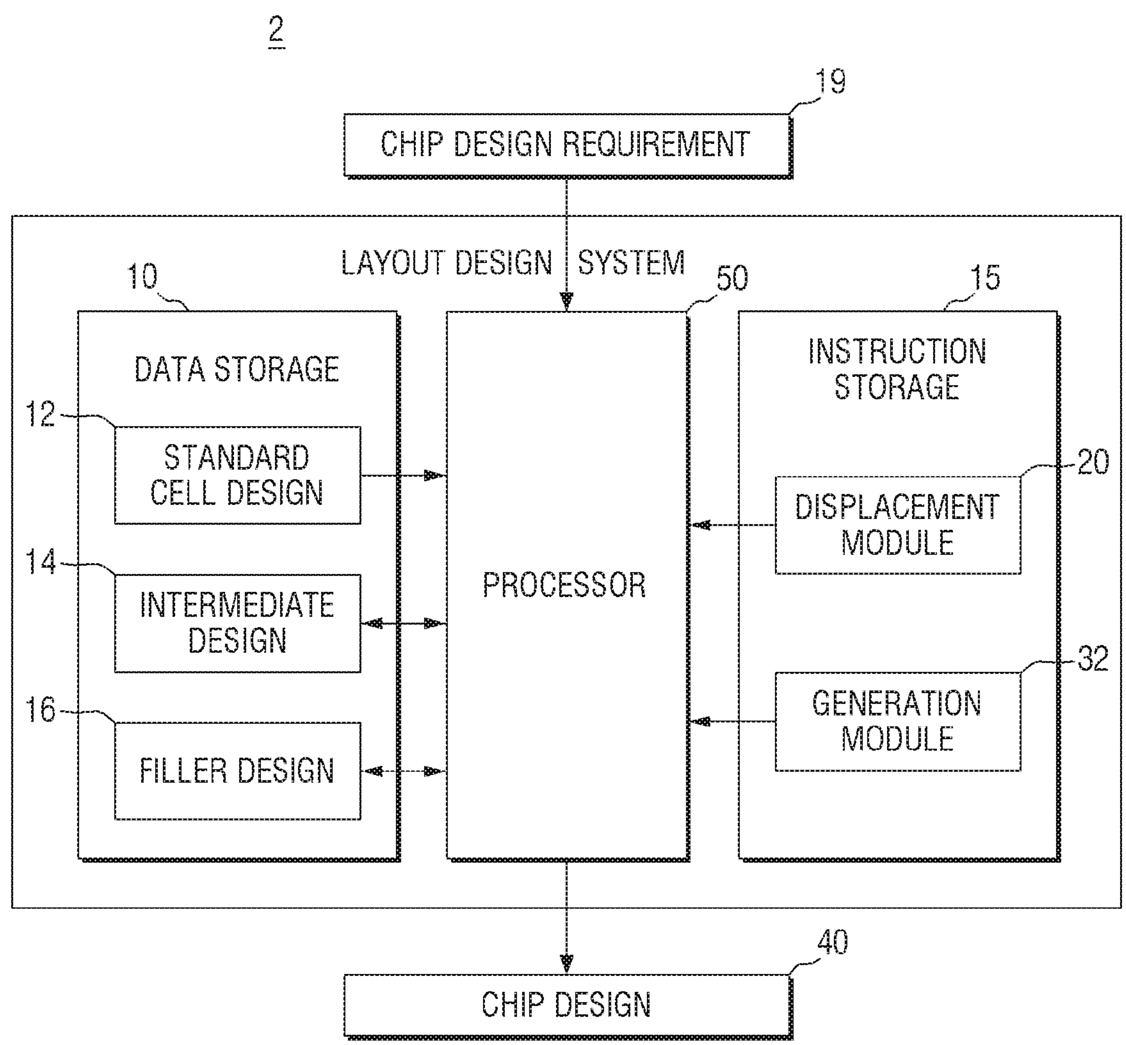
FIG. 7 is a block diagram of a layout design system according to another example embodiment of the inventive concepts.

FIG. 7 is a block diagram of a layout design system according to another example embodiment of the inventive concepts.

Referring to FIG. 7, a data storage unit 10 of a layout design system 2 may include a plurality of candidate filler designs 16.

More specifically, the data storage unit 10 may store a plurality of candidate filler designs 16 each having a plurality of insulating structures that have already been described above with reference to FIGS. 3 through 6.

In the example embodiment, a generation module 32 may exchange a filler design included in an intermediate design 14 for one of the plurality of candidate filler designs 16 stored in the data storage unit 10. For example, the processor 50 may execute the generation module 32 to generate the intermediate design 14 by choosing one of the plurality of candidate filler designs 16, each having a plurality of insulating structures that have already been described above with reference to FIGS. 3 through 6, rather than by newly generating a plurality of insulating structures.

The generation module 32 is illustrated in FIG. 7 as choosing one of the pluralities of candidate filler designs 16, but the inventive concepts are not limited thereto. In some example embodiments, the processor 50 may execute a displacement module 20 to choose one of the plurality of candidate filler designs 16 having different groups of insulating structures. For example, during the arrangement of filler designs, the processor 50 may execute the displacement module 20 to choose a filler design including the insulating structures illustrated in FIG. 4 or a filler design including the insulating structures illustrated in FIG. 6.

Figure 8:
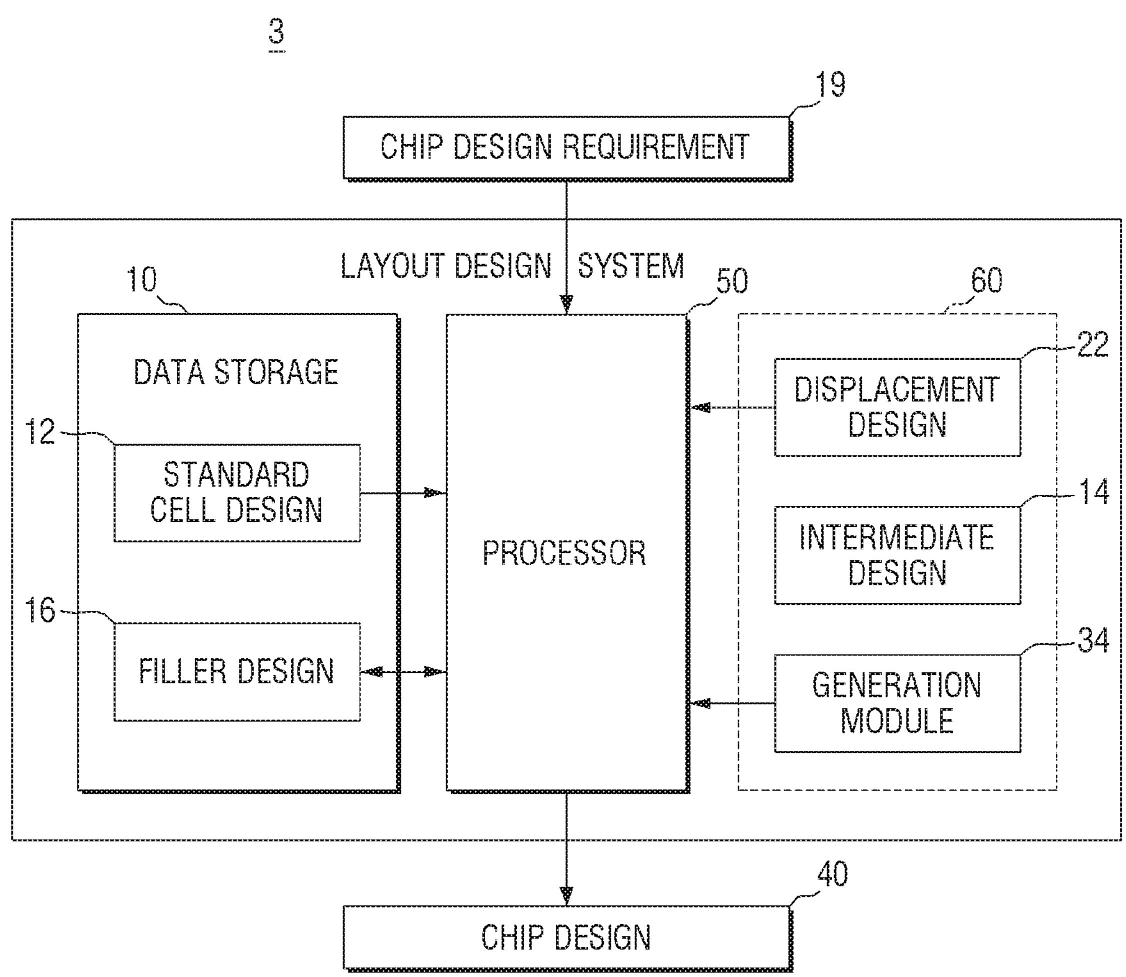
FIG. 8 is a block diagram of a layout design system according to another example embodiment of the inventive concepts.

FIG. 8 is a block diagram of a layout design system according to another example embodiment of the inventive concepts.

Referring to FIG. 8, a displacement module 22 and a generation module 34 of a layout design system 3 may be implemented as a single integration module 60. Accordingly, an intermediate design 14 output by the displacement module 22 may not be stored in a data storage unit 10, but may be provided directly to the generation module 34.

The generation module 34 is illustrated in FIG. 8 as choosing one of a plurality of candidate filler designs 16, but the inventive concepts are not limited thereto. For example, alternatively, the displacement module 22 may be configured to choose one of the plurality of candidate filler designs 16.

Figure 9:
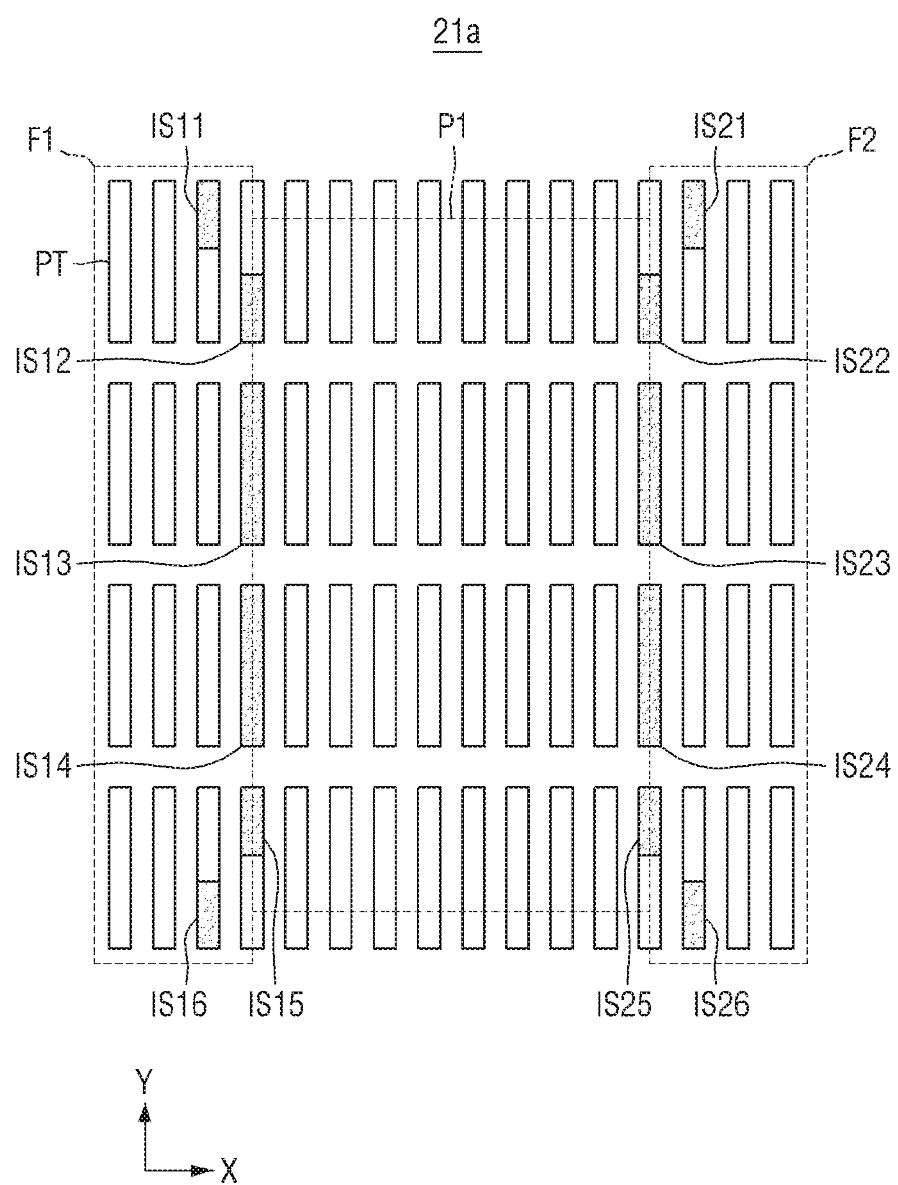
FIG. 9 is a layout view of a semiconductor device according to another example embodiment of the inventive concepts.

FIG. 9 is a layout view of a semiconductor device according to another example embodiment of the inventive concepts.

Referring to FIG. 9, a semiconductor device 21*a* includes first and second cells F1 and P1. In some example embodiments, the semiconductor device 21*a* may be a power gating cell.

The first cell F1 may include first and second insulating structures IS11 and IS12, which are formed in a first direction Y, and may be defined by first cell boundaries.

The first cell F1 may correspond to a fill region of a power gating cell. In the fill region, one or more patterns PT and a plurality of insulating structures IS11 through IS16 may be formed. The patterns PT of the first cell F1 may form dummy active patterns, dummy polysilicon patterns, and a dummy decoupling capacitor.

The second cell P1 may be adjacent to the first cell F1 in a second direction X.

The second cell P1 may be an active region of a power gating cell including the patterns PT. The patterns PT of the second cell P1 may form dummy active patterns, dummy polysilicon patterns, and a dummy decoupling capacitor. In some example embodiments, the active region may be, for example, a P-type metal oxide semiconductor (PMOS) switch region of a power gating cell.

The first and second insulating structures IS11 and IS12 may be spaced apart from each other in the second direction X.

In the example embodiment, at least one of the first and second insulating structures IS11 and IS12 may be spaced apart from the first cell boundaries in the second direction X.

In the example embodiment, the first and second insulating structures IS11 and IS12 may differ from each other in their distance from a first cell boundary on a first side of the first cell F1.

In the example embodiment, the first and second insulating structures IS11 and IS12 may not overlap with each other in the second direction X. In other words, the first and second insulating structures IS11 and IS12 may be with a gap therebetween in the first direction Y.

The semiconductor device 21*a* may further include a third cell F2.

The third cell F2 may include third and fourth insulating structures IS21 and IS22, which are formed in the first direction Y, and may be defined by third cell boundaries.

The third cell F2, like the first cell F1, may correspond to a fill region of a power gating cell. In the fill region, one or more patterns PT and a plurality of insulating structures IS21 through IS26 may be formed.

The third and fourth insulating structures IS21 and IS22 may be spaced apart from each other in the second direction X.

In the example embodiment, at least one of the third and fourth insulating structures IS21 and IS22 may be spaced apart from the third cell boundaries in the second direction X.

In the example embodiment, the third and fourth insulating structures IS21 and IS22 may differ from each other in their distance from a third cell boundary on a first side of the third cell F3.

In the example embodiment, the third and fourth insulating structures IS21 and IS22 may not overlap with each other in the second direction X. In other words, the third and fourth insulating structures IS21 and IS22 may be with a gap therebetween in the first direction Y.

Figure 10:
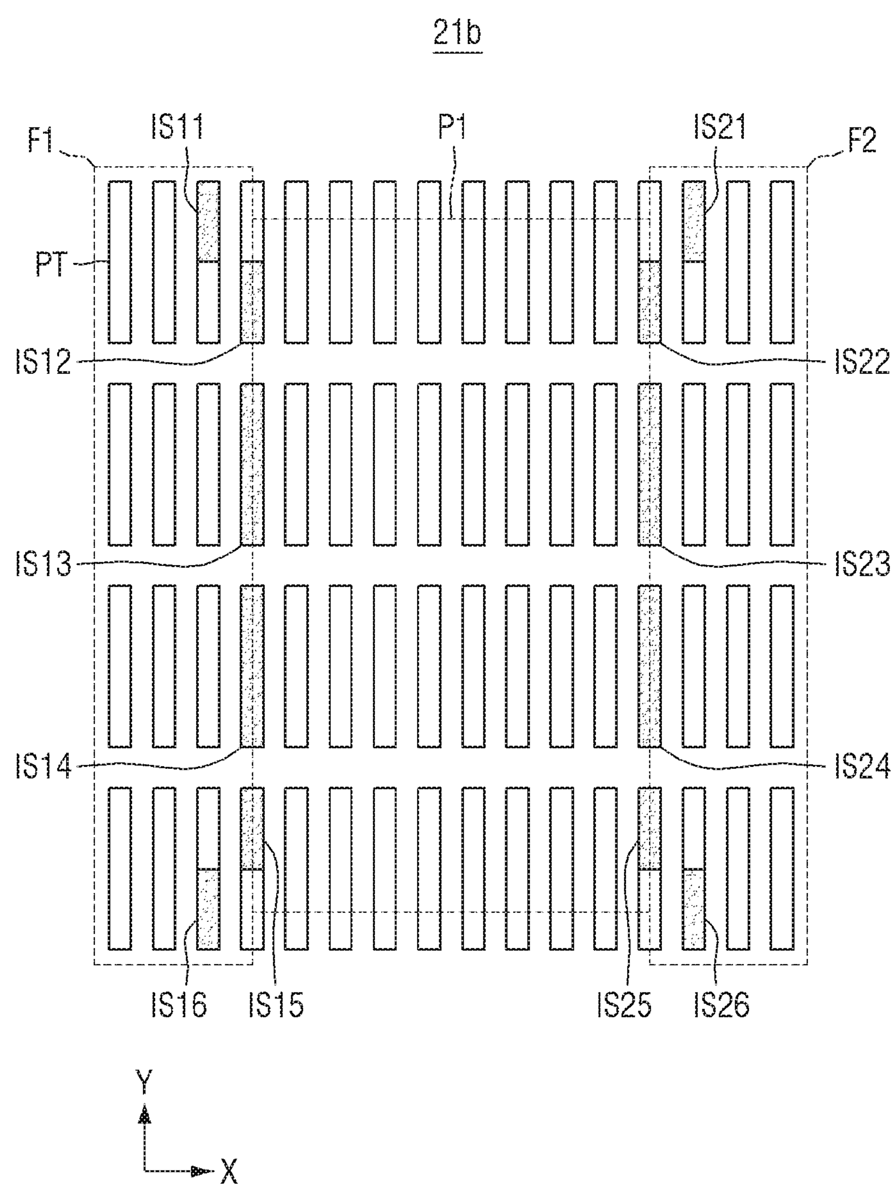
FIG. 10 is a layout view of a semiconductor device according to another example embodiment of the inventive concepts.

FIG. 10 is a layout view of a semiconductor device according to another example embodiment of the inventive concepts.

Referring to FIG. 10, a semiconductor device 21*b* differs from the semiconductor device 21*a* of FIG. 9 in that first and second insulating structures IS11 and IS12 are with no gap therebetween in a first direction Y. Also, third and fourth insulating structures IS21 and IS22 are with no gap therebetween in the first direction Y.

Figure 11:
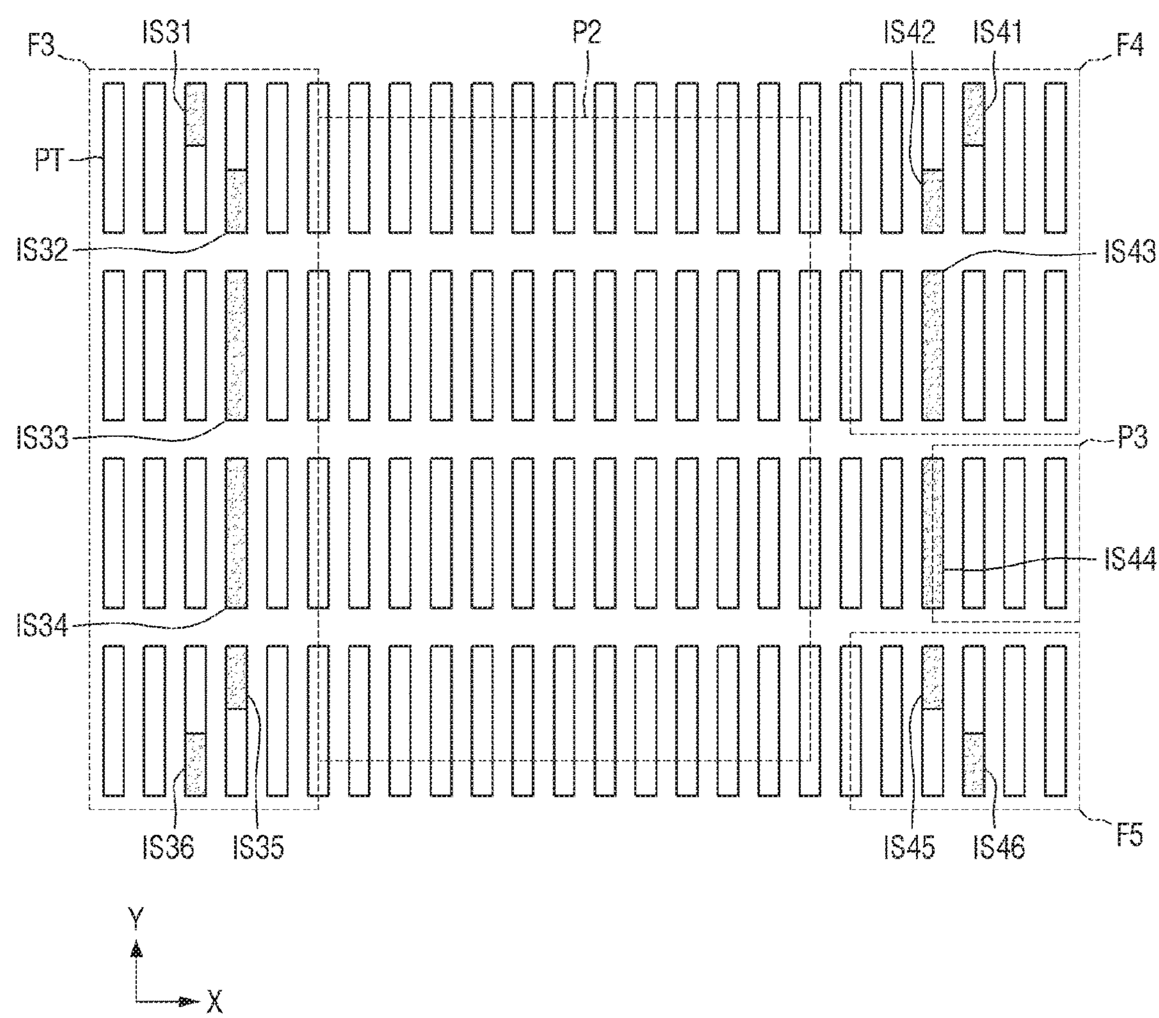
FIG. 11 is a layout view of a semiconductor device according to another example embodiment of the inventive concepts.

FIG. 11 is a layout view of a semiconductor device according to another example embodiment of the inventive concepts.

Referring to FIG. 11, a semiconductor device 22*a* includes first and second cells F3 and P2. The semiconductor device 22*a* further includes third, fourth, and fifth cells F4, P3, and F5. In some example embodiments, the semiconductor device 22*a* may be a power gating cell.

The first cell F3 may include first and second insulating structures IS31 and IS32, which are formed in a first direction Y, and may be defined by first cell boundaries. The third cell F4 may include third and fourth insulating structures IS41 and IS42, which are formed in the first direction Y, and may be defined by third cell boundaries. The fifth cell F5 may include fifth and sixth insulating structures IS45 and IS46, which are formed in the first direction Y, and may be defined by fifth cell boundaries.

The first, third, and fifth cells F3, F4, and F5 may be fill regions of a power gating cell.

The second cell P2 may be adjacent to the first, third, and fourth cells F3, F4, and F5 in a second direction X. The fourth cell P3 may be adjacent to the third and fifth cells F4 and F5 in the first direction Y.

The second and fourth cells P2 and P3 may be active regions of a power gating cell including one or more patterns PT. In some example embodiments, the second cell P2 may be, for example, a PMOS switch region of a power gating cell, and the fourth cell P3 may be, for example, a buffer region of the power gating cell.

The first and second insulating structures IS31 and IS32 may be spaced apart from each other in the second direction X.

In the example embodiment, at least one of the first and second insulating structures IS31 and IS32 may be spaced apart from the first cell boundaries in the second direction X.

In the example embodiment, the first and second insulating structures IS31 and IS32 may differ from each other in their distance from a third cell boundary on a first side of the third cell F3.

In the example embodiment, the first and second insulating structures IS31 and IS32 may not overlap with each other in the second direction X. In other words, the first and second insulating structures IS31 and IS32 may be with a gap therebetween in the first direction Y.

The third and fourth insulating structures IS41 and IS42 or the fifth and sixth insulating structures IS45 and IS46 may be in almost the same manner as the first and second insulating structures IS31 and IS32.

Figure 12:
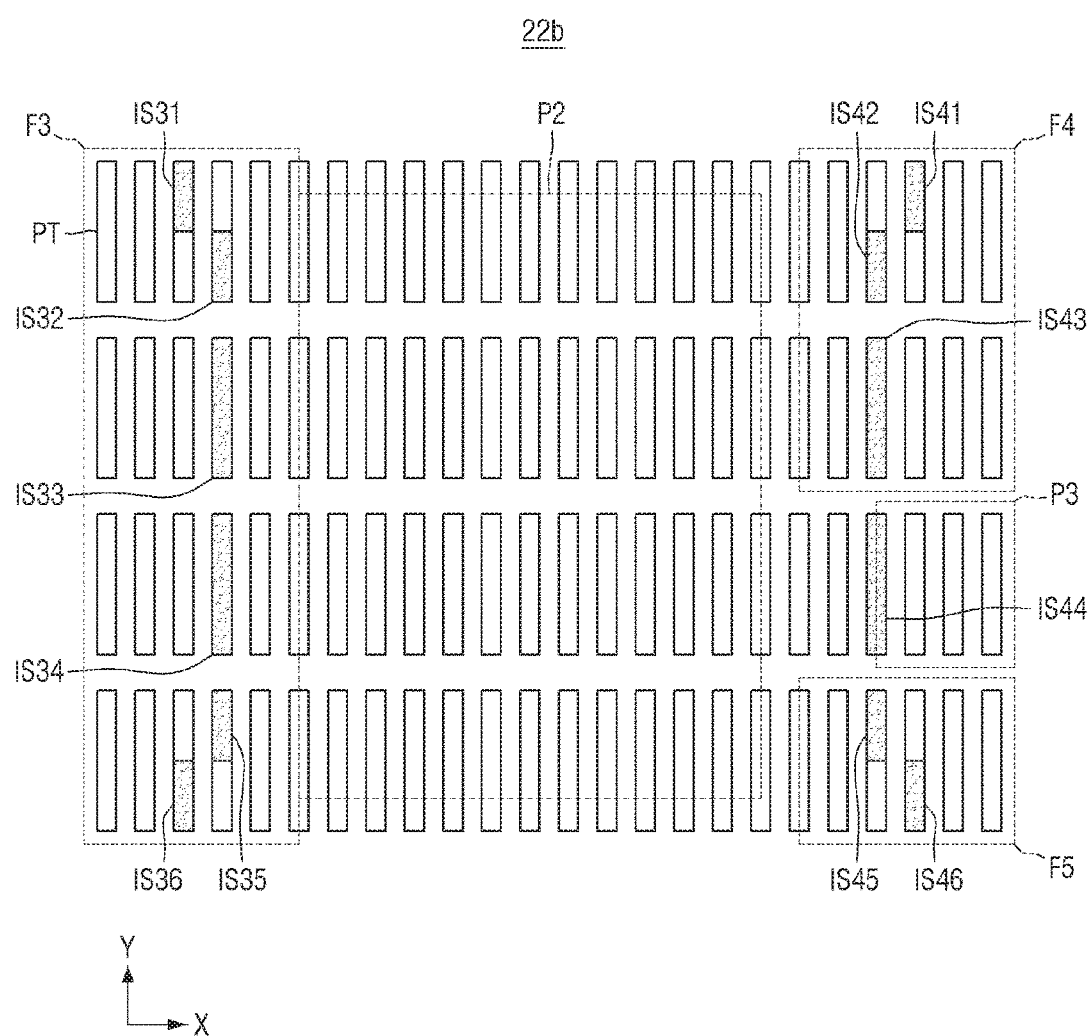
FIG. 12 is a layout view of a semiconductor device according to another example embodiment of the inventive concepts.

FIG. 12 is a layout view of a semiconductor device according to another example embodiment of the inventive concepts.

Referring to FIG. 12, a semiconductor device 22*b* differs from the semiconductor device 22*a* of FIG. 11 in that first and second insulating structures IS31 and IS32 are with no gap therebetween in a first direction Y. Also, third and fourth insulating structures IS41 and IS42 are with no gap therebetween in the first direction Y, and fifth and sixth insulating structures IS45 and IS46 are with no gap therebetween in the first direction Y.

Figure 13:
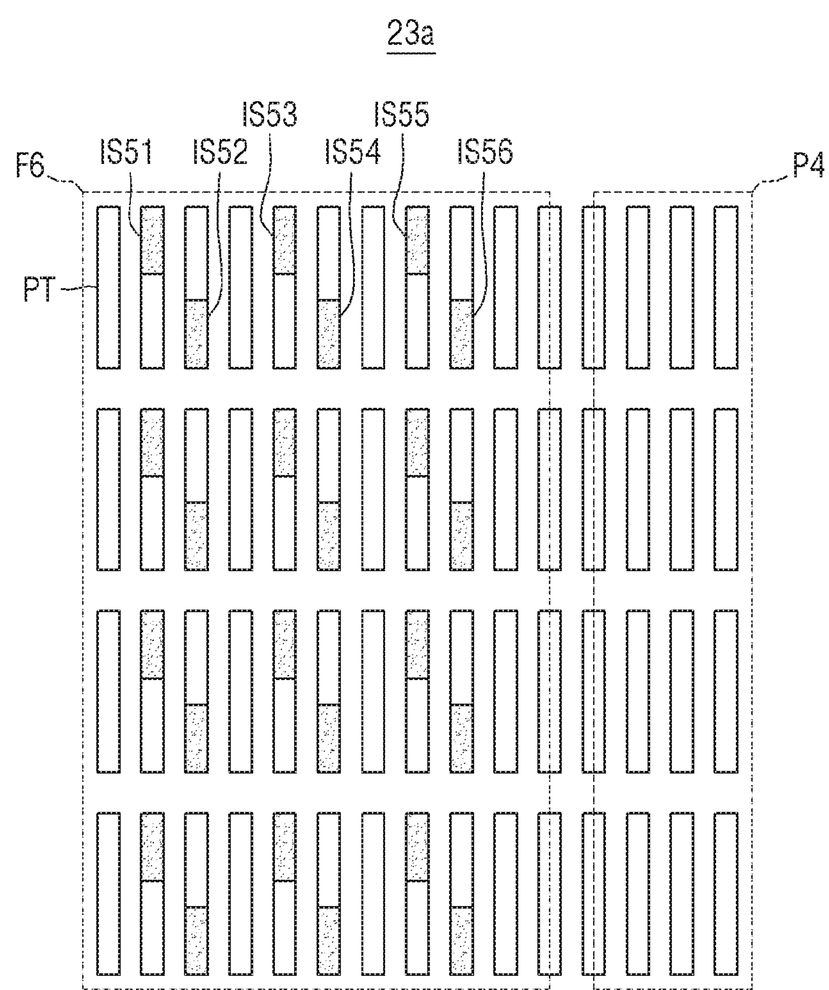
FIG. 13 is a layout view of a semiconductor device according to another example embodiment of the inventive concepts.

FIG. 13 is a layout view of a semiconductor device according to another example embodiment of the inventive concepts.

Referring to FIG. 13, a semiconductor device 23*a* includes first and second cells F6 and P4. In some example embodiments, the semiconductor device 23*a* may be an endcap cell.

The first cell F6 may include first, second, third, fourth, fifth, and sixth insulating structures IS51, IS52, IS53, IS54, IS55, and IS56, which are formed in a first direction Y. The first cell F6 may be defined by first cell boundaries.

The first cell F6 may be a fill region of an endcap cell.

The first, second, third, fourth, fifth, and sixth insulating structures IS51, IS52, IS53, IS54, IS55, and IS56 may be spaced apart from one another in a second direction X.

In the example embodiment, at least one of the first, second, third, fourth, fifth, and sixth insulating structures IS51, IS52, IS53, IS54, IS55, and IS56 may be spaced apart from the first cell boundaries in the second direction X.

In the example embodiment, the first, second, third, fourth, fifth, and sixth insulating structures IS51, IS52, IS53, IS54, IS55, and IS56 may all differ from one another in their distance from a first cell boundary on a first side of the first cell F6.

In the example embodiment, the first, second, third, fourth, fifth, and sixth insulating structures IS51, IS52, IS53, IS54, IS55, and IS56 may not overlap with one another in the second direction X. In other words, the first, second, third, fourth, fifth, and sixth insulating structures IS51, IS52, IS53, IS54, IS55, and IS56 may be with a gap there among in the first direction Y.

Figure 14:
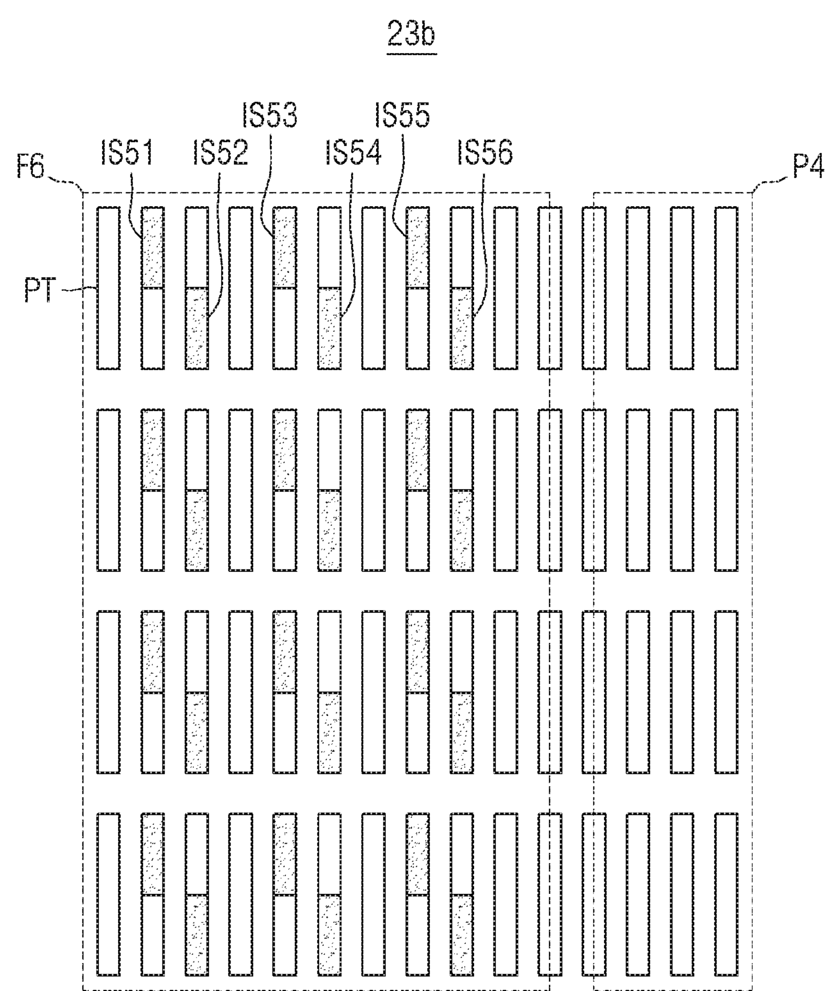
FIG. 14 is a layout view of a semiconductor device according to another example embodiment of the inventive concepts.

FIG. 14 is a layout view of a semiconductor device according to another example embodiment of the inventive concepts.

Referring to FIG. 14, a semiconductor device 23*b* differs from the semiconductor device 23*a* of FIG. 13 in that first, second, third, fourth, fifth, and sixth insulating structures IS51, IS52, IS53, IS54, IS55, and IS56 are with no gap there among in a first direction Y.

In accordance with various example embodiments of the inventive concepts, a plurality of insulating structures can be prevented from being formed in line with one another in one direction, and as a result, too excessive stress may be prevented from being applied to transistors formed in a cell region. Also, a proper insulation may be provided to a semiconductor device.

While the inventive concepts has been particularly illustrated and described with reference to example embodiments thereof, it will be understood by those of ordinary skill in the art that various changes in form and detail may be made therein without departing from the spirit and scope of the inventive concepts as defined by the following claims. The example embodiments should be considered in a descriptive sense only and not for purposes of limitation.

What is claimed is:

1. A semiconductor device, comprising:

a filler cell including first and second insulating structures, the first and second insulating structures extending in a first direction, the filler being defined by first cell boundaries; and a standard cell neighboring the filler cell, the standard cell including a third insulating structure, the third insulating structure extending in the first direction, the neighboring standard cell being adjacent to the filler cell in the first direction and defined by second cell boundaries, wherein the first and second insulating structures are spaced apart from one another in a second direction, the second direction being perpendicular to the first direction, the first insulating structure is connected to the third insulating structure, and the second insulating structure is not connected to the third insulating structure.

2. The semiconductor device of claim 1, wherein at least one of the first and second insulating structures is spaced apart from the first cell boundaries in the second direction.

3. The semiconductor device of claim 1, wherein the first insulating structure is spaced a first distance apart from a first cell boundary on a first side of the filler cell in the second direction, and the second insulating structure is spaced a second distance apart from the first cell boundary on the first side of the filler cell in the second direction, and the second distance is different from the first distance.

4. The semiconductor device of claim 1, wherein the first and second insulating structures do not overlap with each other in the second direction.

5. The semiconductor device of claim 1, wherein the filler cell further includes fourth and fifth insulating structures, extending in the first direction, the first and second insulating structures are with a first gap therebetween in the second direction; and the fourth and fifth insulating structures are with the first gap therebetween in the second direction.

6. The semiconductor device of claim 5, wherein the fourth and fifth insulating structures do not overlap with each other in the second direction.

7. The semiconductor device of claim 1, wherein the standard cell includes an active region having at least one of a switch region of a power gating cell or a buffer region of the power gating cell.

8. The semiconductor device of claim 7, wherein the active region is a PMOS switch region of the power gating cell.

9. A semiconductor device, comprising:

a first filler cell including first and second insulating structures, the first and second insulating structures extending in a first direction, the first filler cell being defined by first cell boundaries; and a first standard cell neighboring the first filler cell, the first standard cell including a third insulating structure, the third insulating structure extending in the first direction, the first standard cell being adjacent to the first filler cell in the first direction and defined by second cell boundaries, wherein the first and second insulating structures are spaced apart from each other in a second direction that is perpendicular to the first direction, wherein the first insulating structure is connected to the third insulating structure and the second insulating structure is not connected to the third insulating structure, wherein the first and second insulating structures do not overlap with each other in the second direction.

10. The semiconductor device of claim 9, wherein at least one of the first and second insulating structures is spaced apart from the first cell boundaries in the second direction.

11. The semiconductor device of claim 9, wherein the first insulating structure is spaced a first distance apart from a first cell boundary on a first side of the first filler cell in the second direction, and the second insulating structure is spaced a second distance apart from the first filler cell boundary on the first side of the first filler cell in the second direction, the second distance being different from the first distance.

12. The semiconductor device of claim 9, wherein the first and second insulating structures extend in the first filler cell.

13. The semiconductor device of claim 9, wherein the first filler cell further includes third and fourth insulating structures, the third and fourth insulating structures extending in the first direction, the first and second insulating structures include a first gap therebetween in the second direction, and the third and fourth insulating structures include the first gap therebetween in the second direction.

14. The semiconductor device of claim 13, wherein the third and fourth insulating structures do not overlap with one another in the second direction.

15. A method of fabricating a semiconductor device comprising:

executing machine readable instructions on a processor to generate at least one filler cell for placement between a first standard cell and a second standard cell for a layout of the semiconductor device, the at least one filler cell including first and second insulating structures extending in a first direction, the first insulating structure inline with a third insulating structure in the first standard cell, the second insulating structure not inline with an insulating structure in the second standard cell, the first and second insulating structures being spaced apart from one another in a second direction, the second direction being perpendicular to the first direction; and fabricating the semiconductor device according to the layout.

16. The method of claim 15, further comprising:

storing a plurality of candidate filler cells, wherein the processor is configured to execute the machine readable instructions to store the at least one filler cell in the plurality of candidate filler cells.

17. The method of claim 16, further comprising:

storing a plurality of intermediate cells, and wherein the processor is configured to execute the machine readable instructions to exchange at least one of the plurality of intermediate cells for at least one of the plurality of candidate filler cells.

18. The method of claim 16, further comprising:

storing a plurality of chip design requirements and a plurality of standard cell designs, and wherein the processor is configured to execute the machine readable instructions to arrange the plurality of standard cell designs and the plurality of candidate filler cells according to the plurality of chip design requirements.

19. The method of claim 17, wherein the processor is configured to execute the machine readable instructions to generate the plurality of intermediate cells by arranging standard cell designs according to a chip design requirement.

* * * * *